US012622268B2

(12) United States Patent
Terasaki

(10) Patent No.: US 12,622,268 B2
(45) Date of Patent: May 5, 2026

(54) COPPER/CERAMIC BONDED BODY AND INSULATING CIRCUIT SUBSTRATE

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 21 days.

(21) Appl. No.: 18/291,255

(22) PCT Filed: Jul. 29, 2022

(86) PCT No.: PCT/JP2022/029314
§ 371 (c)(1),
(2) Date: Jan. 23, 2024

(87) PCT Pub. No.: WO2023/008562
PCT Pub. Date: Feb. 2, 2023

(65) Prior Publication Data
US 2024/0363480 A1 Oct. 31, 2024

(30) Foreign Application Priority Data
Jul. 30, 2021 (JP) ................................. 2021-125531

(51) Int. Cl.
*H01L 23/373* (2006.01)
*H01L 23/00* (2006.01)
(Continued)

(52) U.S. Cl.
CPC ........ *H10W 40/255* (2026.01); *H10W 70/685* (2026.01); *H10W 70/692* (2026.01); *H10W 72/30* (2026.01)

(58) Field of Classification Search
None
See application file for complete search history.

(56) References Cited

U.S. PATENT DOCUMENTS 4,988,034 A * 1/1991 Taniguchi ............. C04B 37/026
228/124.1
2016/0221305 A1 8/2016 Terasaki et al.
(Continued)

FOREIGN PATENT DOCUMENTS

JP H06-048851 A 2/1994
JP H06-048852 A 2/1994
(Continued)

OTHER PUBLICATIONS

English machine translation of JP 2002-274964, EPO, accessed May 23, 2025.*
(Continued)

*Primary Examiner* — Xiaobei Wang
(74) *Attorney, Agent, or Firm* — Troutman Pepper Locke LLP

(57) ABSTRACT

The copper/ceramic bonded body according to the present invention is a copper/ceramic bonded body obtained by bonding copper members consisting of copper or a copper alloy to a ceramic member, where at a bonded interface between the ceramic member and each of the copper members, the distance between the ceramic member and each of the copper members in an end portion of each of the copper members is in a range of 3 µm or more and 30 µm or less, and a void ratio in an end portion region (E) of each of the copper members is 10% or less.

17 Claims, 4 Drawing Sheets

(51) Int. Cl.

| | | |
|---|---|---|
| *H01L 23/15* | (2006.01) |
| *H01L 23/498* | (2006.01) |
| *H10W 40/25* | (2026.01) |
| *H10W 70/685* | (2026.01) |
| *H10W 70/692* | (2026.01) |
| *H10W 72/30* | (2026.01) |

(56) References Cited

U.S. PATENT DOCUMENTS

| | | | |
|---|---|---|---|
| 2019/0135706 A1 | 5/2019 | Terasaki | |
| 2019/0150298 A1* | 5/2019 | Kishimoto | C22C 5/06 174/252 |
| 2020/0128664 A1 | 4/2020 | Harada et al. | |
| 2021/0176860 A1 | 6/2021 | Tsugawa et al. | |
| 2022/0030708 A1* | 1/2022 | Ebigase | C04B 37/026 |
| 2024/0290684 A1* | 8/2024 | Fukui | H01L 24/83 |

FOREIGN PATENT DOCUMENTS

| | | |
|---|---|---|
| JP | H08064932 A | 3/1996 |
| JP | H10-004156 A | 1/1998 |
| JP | H10-041526 A | 2/1998 |
| JP | 2000-101203 A | 4/2000 |
| JP | 2001220254 A | 8/2001 |
| JP | 3211856 B2 | 9/2001 |
| JP | 2002-274964 A | 9/2002 |
| JP | 2003-055058 A | 2/2003 |
| JP | 2004119312 A | 4/2004 |
| JP | 2011124585 A | 6/2011 |
| JP | 2014-090144 A | 5/2014 |
| JP | 2015-092552 A | 5/2015 |
| JP | 5757359 B2 | 7/2015 |
| JP | 5957862 B2 | 7/2016 |
| JP | 2016-169111 A | 9/2016 |
| JP | 2018-008869 A | 1/2018 |
| JP | 2018-157135 A | 10/2018 |
| JP | 2020-053580 A | 4/2020 |
| JP | 2021075452 A | 5/2021 |
| JP | 2021-098641 A | 7/2021 |
| WO | 2017/213207 A1 | 12/2017 |
| WO | 2018/199060 A1 | 11/2018 |
| WO | 2018/221493 A1 | 12/2018 |

OTHER PUBLICATIONS

Office Action mailed Jan. 14, 2025, issued for JP2021-125531 and English translation thereof.

International Search Report mailed Sep. 20, 2022, issued for PCT/JP2022/029314 and English translation thereof.

Notice of Allowance mailed Mar. 11, 2025, issued for JP2021-125531 and English translation thereof.

Office Action mailed Jul. 26, 2025, issued for Chinese Patent Application No. 2022-80051700.6 and English translation thereof.

Office Action mailed Jan. 21, 2026, issued for Chinese Patent Application No. 2022-80051700.6 and English translation thereof.

\* cited by examiner

COPPER/CERAMIC BONDED BODY AND INSULATING CIRCUIT SUBSTRATE

TECHNICAL FIELD

The present invention relates to a copper/ceramic bonded body obtained by bonding a copper member consisting of copper or a copper alloy to a ceramic member, and an insulating circuit substrate including a ceramic substrate and a copper sheet consisting of copper or a copper alloy, which is bonded to a surface of the ceramic substrate.

Priority is claimed on Japanese Patent Application No. 2021-125531, filed Jul. 30, 2021, the content of which is incorporated herein by reference.

BACKGROUND ART

A power module, an LED module, and a thermoelectric module have a structure in which a power semiconductor element, an LED element, and a thermoelectric element are bonded to an insulating circuit substrate in which a circuit layer consisting of a conductive material is formed on one surface of an insulating layer.

For example, a power semiconductor element for high power control, which is used for controlling wind power generation, an electric vehicle, a hybrid vehicle, or the like, generates a large amount of heat during operation, and thus, an insulating circuit substrate including a ceramic substrate, a circuit layer formed by bonding a metal plate having excellent electrical conductivity to one surface of the ceramic substrate, and a metal layer for heat radiation, which is formed by bonding a metal plate to the other surface of the ceramic substrate has been widely used in the related art as a substrate on which the power semiconductor element is mounted.

For example, Patent Document 1 proposes an insulating circuit substrate in which a circuit layer and a metal layer are formed by bonding a copper sheet to one surface and the other surface of a ceramic substrate. In Patent Document 1, the copper sheet is disposed on one surface of the ceramic substrate and the other surface thereof with an Ag—Cu—Ti-based brazing material being interposed, and then a heating treatment is carried out to bond the copper sheet (so-called active metal brazing method).

In addition, Patent Document 2 proposes a power module substrate in which a copper sheet consisting of copper or a copper alloy is bonded to a ceramic substrate consisting of AlN or $Al_2O_3$ by using a bonding material containing Ag and Ti.

Further, Patent Document 3 proposes a power module substrate in which an aluminum sheet consisting of aluminum or an aluminum alloy is bonded to a ceramic substrate by using a brazing material consisting of an alloy such as an Al—Si-based, Al—Ge-based, Al—Cu-based, Al—Mg-based, or Al—Mn-based alloy. In addition, according to Patent Document 3, an overhang part is formed in the periphery of each of a circuit layer formed on one surface of the ceramic substrate and a heat radiation layer formed on the other surface of the ceramic substrate. As a result, insulating properties between the circuit layer and the heat radiation layer are ensured, and concurrently, the heat capacity in the circuit layer and the heat radiation layer is increased.

CITATION LIST

Patent Documents

[Patent Document 1]
Japanese Patent No. 3211856
[Patent Document 2]
Japanese Patent No. 5757359
[Patent Document 3]
Japanese Patent No. 5957862

SUMMARY OF INVENTION

Technical Problem

By the way, in recent years, there is a tendency that a heat generation temperature of a semiconductor element mounted on an insulating circuit substrate increases, and an insulating circuit substrate is required to have a thermal cycle reliability that can withstand a thermal cycle more severe than a thermal cycle in the related art.

Here, in an insulating circuit substrate obtained by bonding a copper sheet to a ceramic substrate, in a case where an overhang part is formed on the circuit layer as described in Patent Document 3, there is a risk that thermal stress is concentrated on the end portion of the circuit layer, and the bonding reliability is decreased in a case where a thermal cycle is loaded.

On the other hand, in a case where the thickness of the bonding layer in the end portion is increased in order to ensure the strength in the end portion of the copper member, there is a risk that a bonding material arranged between the copper member and the ceramic member protrudes out to cause a defect called "braze staining" occurs.

The present invention has been made in consideration of the above-described circumstances, and an object of the present invention is to provide a copper/ceramic bonded body in which thermal cycle reliability is excellent and the occurrence of braze staining is sufficiently suppressed, and an insulating circuit substrate consisting of this copper/ceramic bonded body.

Solution to Problem

In order to solve the above-described problem, the copper/ceramic bonded body according to one aspect of the present invention is characterized being a copper/ceramic bonded body obtained by bonding a copper member consisting of copper or a copper alloy to a ceramic member, in which at a bonded interface between the ceramic member and the copper member, the distance between the ceramic member and the copper member in an end portion of the copper member is set to be in a range of 3 μm or more and 30 μm or less, and a void ratio in an end portion region of the copper member is 10% or less.

According to the copper/ceramic bonded body according to one aspect of the present invention, the distance between the ceramic member and the copper member in an end portion of the copper member is set to 3 μm or more at a bonded interface between the ceramic member and the copper member, and a void ratio in an end portion region of the copper member is set to 10% or less, and thus the thickness of the bonding layer on the end surface is ensured, which makes it possible to sufficiently ensure the strength of the end portion. As a result, it is possible to suppress the breaking or peeling of the ceramic member in a case where a thermal cycle is loaded.

In addition, since the distance between the ceramic member and the copper member in an end portion of the copper member is set to 30 μm or less, it is possible to suppress the protrusion of the bonding material, and it is possible to suppress the occurrence of "braze staining".

Here, in the copper/ceramic bonded body according to one aspect of the present invention, it is preferable that at the bonded interface between the ceramic member and the copper member, an active metal compound layer is formed on a side of the ceramic member, and a thickness $t1_A$ of the active metal compound layer in the end portion of the copper member and a thickness $t1_B$ of the active metal compound layer in a central part of the copper member are set to be in a range of 0.05 μm or more and 1.2 μm or less, where a thickness ratio $t1_A/t1_B$ is set to be in a range of 0.7 or more and 1.4 or less.

In this case, since the thickness $t1_A$ of the active metal compound layer in the end portion of the copper member and the thickness $t1_B$ of the active metal compound layer in the central part of the copper member are set to be in a range of 0.05 μm or more and 1.2 μm or less, the active metal reliably and firmly bonds the ceramic member to the copper member, and concurrently, the hardening of the bonded interface is suppressed.

In addition, since the thickness ratio $t1_A/t1_B$ is set to be in a range of 0.7 or more and 1.4 or less, there is no significant difference in the hardness of the bonded interface in the end portion and the central part of the copper member, and the occurrence of breaking in the ceramic member during loading of a thermal cycle can be further suppressed.

In addition, in the copper/ceramic bonded body according to one aspect of the present invention, it is preferable that at the bonded interface between the ceramic member and the copper member, an Ag—Cu alloy layer is formed on a side of the copper member, and a thickness $t2_A$ of the Ag—Cu alloy layer in the end portion of the copper member and a thickness $t2_B$ of the Ag—Cu alloy layer in a central part of the copper member are set to be in a range of 3 μm or more and 30 μm or less, where a thickness ratio $t2_A/t2_B$ is set to be in a range of 0.7 or more and 1.4 or less.

In this case, since the thickness $t2_A$ of the Ag—Cu alloy layer in the end portion of the copper member and the thickness $t2_B$ of the Ag—Cu alloy layer in the central part of the copper member are set to be in a range of 3 μm or more and 30 μm or less, the Ag of the bonding material is sufficiently reacted with the copper member to bond the ceramic member to the copper member reliably and firmly, and concurrently, the hardening of the bonded interface is suppressed.

In addition, since the thickness ratio $t2_A/t2_B$ is set to be in a range of 0.7 or more and 1.4 or less, there is no significant difference in the hardness of the bonded interface in the end portion and the central part of the copper member, and the occurrence of breaking in the ceramic member during loading of a thermal cycle can be further suppressed.

The insulating circuit substrate according to one aspect of the present invention is characterized being an insulating circuit substrate obtained by bonding a copper sheet consisting of copper or a copper alloy to a surface of a ceramic substrate, in which at a bonded interface between the ceramic substrate and the copper sheet, the distance between the ceramic substrate and the copper sheet in an end portion of the copper sheet is set to be in a range of 3 μm or more and 30 μm or less, and the void ratio in an end portion region of the copper sheet is 10% or less.

According to the insulating circuit substrate according to one aspect of the present invention, the distance between the ceramic substrate and the copper sheet in an end portion of the copper sheet is set to 3 μm or more at a bonded interface between the ceramic substrate and the copper sheet, and a void ratio in an end portion region of the copper sheet is set to 10% or less, and thus the thickness of the bonding layer on the end surface is ensured, which makes it possible to sufficiently ensure the strength of the end portion. As a result, it is possible to suppress the breaking or peeling of the ceramic substrate in a case where a thermal cycle is loaded.

In addition, since the distance between the ceramic substrate and the copper sheet in an end portion of the copper sheet is set to 30 μm or less, it is possible to suppress the protrusion of the bonding material, and it is possible to suppress the occurrence of "braze staining".

Here, in the insulating circuit substrate according to one aspect of the present invention, it is preferable that a thickness $t1_A$ of the active metal compound layer in the end portion of the copper sheet and a thickness $t1_B$ of the active metal compound layer in a central part of the copper sheet are set to be in a range of 0.05 μm or more and 1.2 μm or less, where a thickness ratio $t1_A/t1_B$ is set to be in a range of 0.7 or more and 1.4 or less.

In this case, since the thickness $t1_A$ of the active metal compound layer in the end portion of the copper sheet and the thickness $t1_B$ of the active metal compound layer in the central part of the copper sheet are set to be in a range of 0.05 μm or more and 1.2 μm or less, the active metal reliably and firmly bonds the ceramic substrate to the copper sheet, and concurrently, the hardening of the bonded interface is suppressed.

In addition, since the thickness ratio $t1_A/t1_B$ is set to be in a range of 0.7 or more and 1.4 or less, there is no significant difference in the hardness of the bonded interface in the end portion and the central part of the copper sheet, and the occurrence of breaking in the ceramic substrate during loading of a thermal cycle can be further suppressed.

In addition, in the insulating circuit substrate according to one aspect of the present invention, it is preferable that at a bonded interface between the ceramic substrate and the copper sheet, an Ag—Cu alloy layer is formed on a side of the copper sheet, and a thickness $t2_A$ of the Ag—Cu alloy layer in the end portion of the copper sheet and a thickness $t2_B$ of the Ag—Cu alloy layer in a central part of the copper sheet are set to be in a range of 3 μm or more and 30 μm or less, where a thickness ratio $t2_A/t2_B$ is set to be in a range of 0.7 or more and 1.4 or less.

In this case, since the thickness $t2_A$ of the Ag—Cu alloy layer in the end portion of the copper sheet and the thickness $t2_B$ of the Ag—Cu alloy layer in the central part of the copper sheet are set to be in a range of 3 μm or more and 30 μm or less, the Ag of the bonding material is sufficiently reacted with the copper sheet to bond the ceramic substrate to the copper sheet reliably and firmly, and concurrently, the hardening of the bonded interface is suppressed.

In addition, since the thickness ratio $t2_A/t2_B$ is set to be in a range of 0.7 or more and 1.4 or less, there is no significant difference in the hardness of the bonded interface in the end portion and the central part of the copper sheet, and the occurrence of breaking in the ceramic substrate during loading of a thermal cycle can be further suppressed.

Advantageous Effects of Invention

According to the present invention, it is possible to provide a copper/ceramic bonded body in which thermal cycle reliability is excellent and the occurrence of braze staining is sufficiently suppressed, and an insulating circuit substrate consisting of this copper/ceramic bonded body.

DESCRIPTION OF EMBODIMENTS

Hereinafter, embodiments of the present invention will be described with reference to the accompanying drawings.

Figure 1:
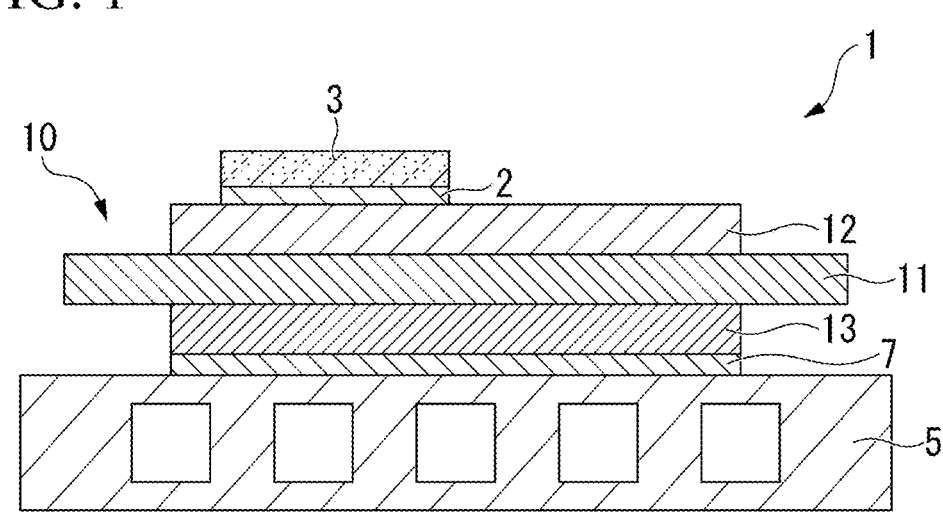
FIG. 1 is a schematic explanatory view of a power module using an insulating circuit substrate according to the embodiment of the present invention.

The copper/ceramic bonded body according to the present embodiment is an insulating circuit substrate 10 obtained by bonding a ceramic substrate 11 as a ceramic member consisting of ceramics, to a copper sheet 42 (a circuit layer 12) as a copper member consisting of copper or a copper alloy and a copper sheet 43 (a metal layer 13). FIG. 1 shows a power module 1 including an insulating circuit substrate 10 according to the present embodiment.

The power module 1 includes the insulating circuit substrate 10 on which each of the circuit layer 12 and the metal layer 13 is arranged; a semiconductor element 3 bonded to one surface (the upper surface in FIG. 1) of the circuit layer 12 by interposing a bonding layer 2; and a heat sink 5 disposed on the other side (the lower side in FIG. 1) of the metal layer 13.

The semiconductor element 3 is composed of a semiconductor material such as Si. The semiconductor element 3 and the circuit layer 12 are bonded with the bonding layer 2 being interposed therebetween.

The bonding layer 2 is composed of, for example, an Sn—Ag-based solder material, an Sn—In-based solder material, or an Sn—Ag—Cu-based solder material.

The heat sink 5 is a heat sink for dissipating heat from the insulating circuit substrate 10 described above. The heat sink 5 is composed of copper or a copper alloy, and in the present embodiment, it is composed of phosphorus deoxidized copper. The heat sink 5 includes a passage for allowing a cooling fluid to flow.

It is noted that in the present embodiment, the heat sink 5 is bonded to the metal layer 13 by a solder layer 7 which consists of a solder material. The solder layer 7 is composed of, for example, an Sn—Ag-based solder material, an Sn—In-based solder material, or an Sn—Ag—Cu-based solder material.

In addition, the insulating circuit substrate 10 which is the present embodiment includes, as shown in FIG. 1, the ceramic substrate 11, the circuit layer 12 arranged on one surface of the ceramic substrate 11 (the upper surface in FIG. 1), and the metal layer 13 arranged on the other surface of the ceramic substrate 11 (the lower surface in FIG. 1).

The ceramic substrate 11 is composed of ceramics such as silicon nitride ($Si_3N_4$), aluminum nitride (AlN), and alumina ($Al_2O_3$), which are excellent in terms of insulating properties and heat radiation. In the present embodiment, the ceramic substrate 11 is composed of aluminum nitride (AlN), which is excellent, particularly in terms of heat radiation. In addition, the thickness of the ceramic substrate 11 is set, for example, in a range of 0.2 mm or more and 1.5 mm or less, and the thickness thereof is set to 0.635 mm in the present embodiment.

Figure 5:
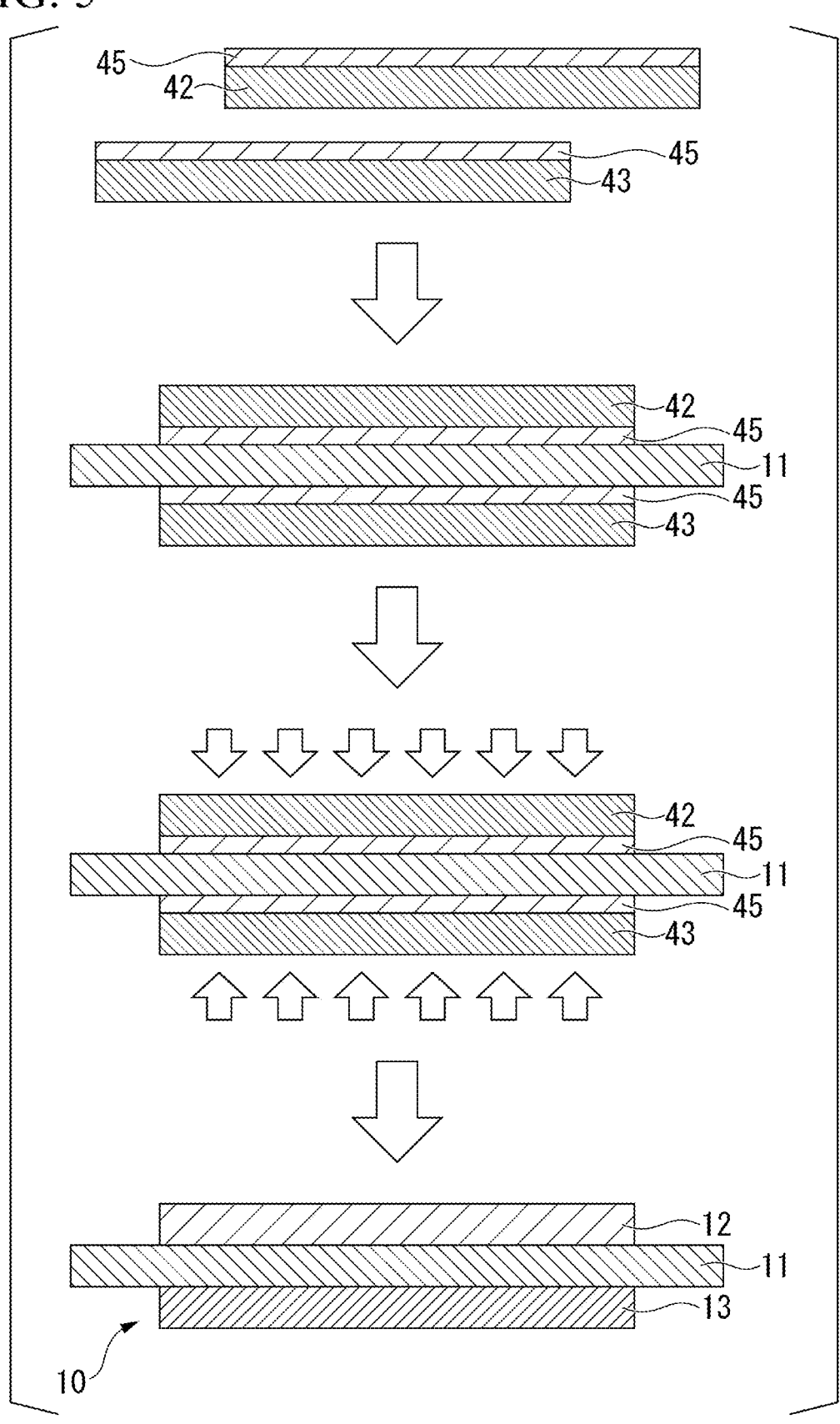
FIG. 5 is a schematic explanatory view of the manufacturing method for the insulating circuit substrate according to the embodiment of the present invention.

As shown in FIG. 5, the circuit layer 12 is formed by bonding the copper sheet 42 consisting of copper or a copper alloy to one surface (the upper surface in FIG. 5) of the ceramic substrate 11.

In the present embodiment, the circuit layer 12 is formed by bonding a rolled plate of oxygen-free copper to the ceramic substrate 11.

It is noted that the thickness of the copper sheet 42 which is to be the circuit layer 12 is set to be in a range of 0.1 mm or more and 2.0 mm or less, and the thickness is set to 0.6 mm in the present embodiment.

As shown in FIG. 5, the metal layer 13 is formed by bonding the copper sheet 43 consisting of copper or a copper alloy to the other surface (the lower surface in FIG. 5) of the ceramic substrate 11.

In the present embodiment, the metal layer 13 is formed by bonding a rolled plate of oxygen-free copper to the ceramic substrate 11.

It is noted that the thickness of the copper sheet 43 which is to be the metal layer 13 is set to be in a range of 0.1 mm or more and 2.0 mm or less, and the thickness is set to 0.6 mm in the present embodiment.

Figure 2:
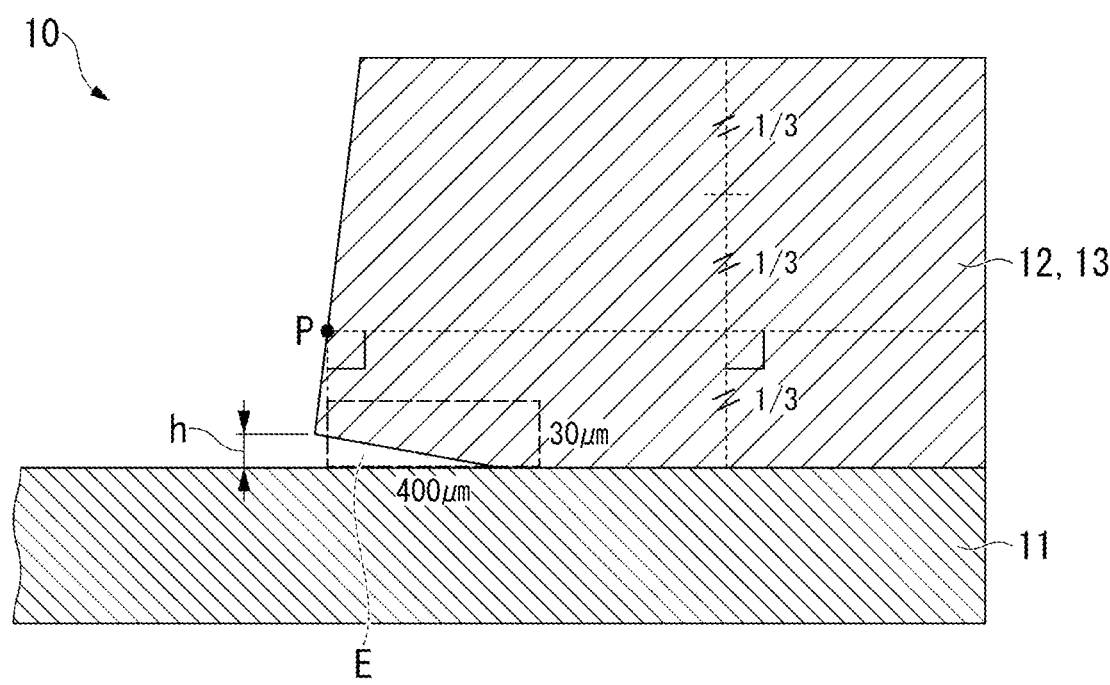
FIG. 2 is an enlarged explanatory view of a circuit layer and an end portion of a metal layer in the insulating circuit substrate according to the embodiment of the present invention.

In addition, in the insulating circuit substrate 10 which is the present embodiment, as shown in FIG. 2, a distance h between the ceramic substrate 11 and each of the circuit layer 12 and the metal layer 13 at the end portion of each of the circuit layer 12 and the metal layer 13 is set to be in a range of 3 μm or more and 30 μm or less at the bonded interface between the ceramic substrate 11 and each of the circuit layer 12 and the metal layer 13. Said differently, the copper sheet has a chamfered surface on a peripheral edge of a surface that faces the ceramic substrate to form a crevice between the copper sheet and the ceramic substrate. At a bonded interface between the ceramic substrate and the copper sheet, a height h of the crevice from a surface of the ceramic substrate to an outermost edge of the copper sheet in a lamination direction is set to be in a range of 3 μm or more and 30 μm or less.

Further, in the insulating circuit substrate 10 which is the present embodiment, as shown in FIG. 2, the void ratio in an end portion region E of each of the circuit layer 12 and metal layer 13 at the bonded interface between the ceramic substrate 11 and each of the circuit layer 12 and metal layer 13 is set to 10% or less.

Here, as shown in FIG. 2, in the cross-sectional observation of the bonded interface between the ceramic substrate 11 and each of the circuit layer 12 and the metal layer 13, the end portion region in the present embodiment is a region having a height of 30 μm from the surface of the ceramic substrate 11 to the side of each of the circuit layer 12 and the metal layer 13, and a width of 400 μm along the surface of the ceramic substrate 11 to the side of the central part of each of the circuit layer 12 and the metal layer 13, where the starting point is an intersection P formed by a perpendicular line and a line parallel to the ceramic substrate 11, the perpendicular line extending from the end surface position of each of the circuit layer 12 and the metal layer 13 at a position located at ⅓ of the thickness of each of the circuit layer 12 and the metal layer 13 from the ceramic substrate 11.

It is noted that in a case where the thickness of each of the circuit layer 12 and the metal layer 13 is less than 90 μm, the end portion region is a region having a height of ⅓ of the thickness of each of the circuit layer 12 and the metal layer 13 from the surface of the ceramic substrate 11 to the side of each of the circuit layer 12 and the metal layer 13, and a width of 400 μm along the surface of the ceramic substrate 11 to the side of the central part of each of the circuit layer 12 and the metal layer 13, where the starting point is an intersection P formed by a perpendicular line and a line parallel to the ceramic substrate 11, the perpendicular line extending from the end surface position of each of the circuit layer 12 and the metal layer 13 at a position located at ⅓ of the thickness of each of the circuit layer 12 and the metal layer 13 from the ceramic substrate 11.

Further, the void ratio is calculated as follows. In the above-described end portion region, a region in which a metal constituting the circuit layer 12 and the metal layer 13 is not present is defined as a void part, and a proportion of the void part in the above-described end portion region is defined as a void ratio.

Figure 3A:
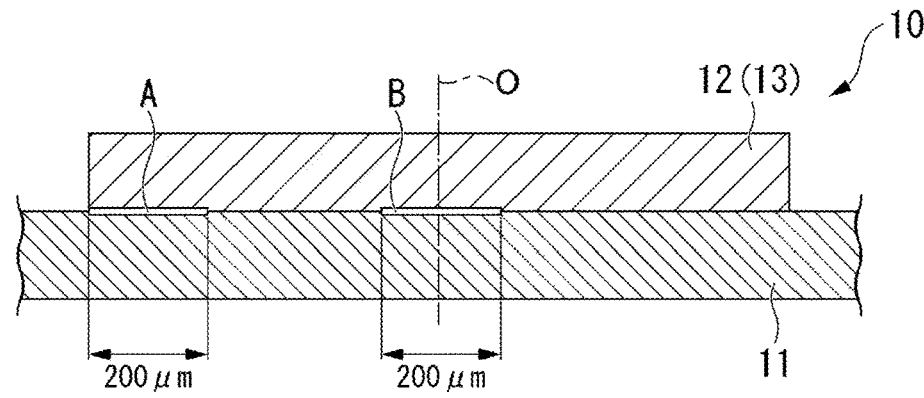
FIG. 3A is an enlarged explanatory view of a circuit layer and a bonded interface between a metal layer and a ceramic substrate in the insulating circuit substrate according to the embodiment of the present invention.
Figure 3B:
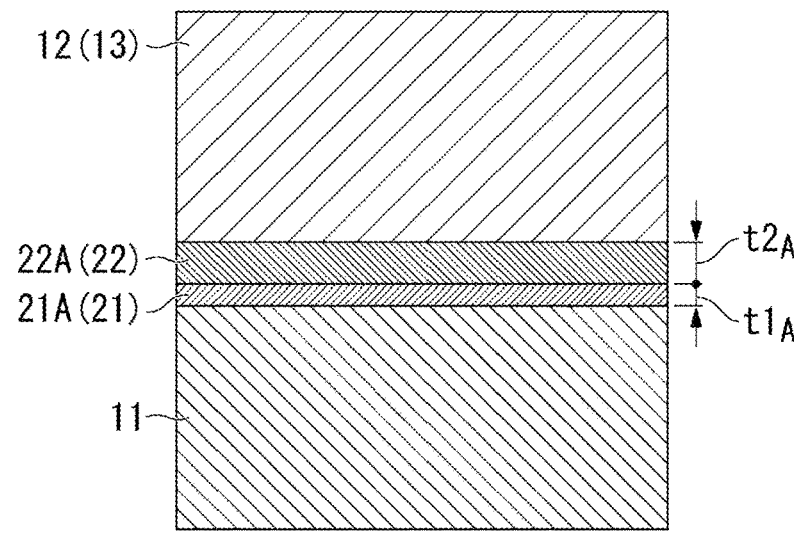
FIG. 3B is an enlarged view of the end portion of the bonded interface of the insulating circuit substrate of FIG. 3A.
Figure 3C:
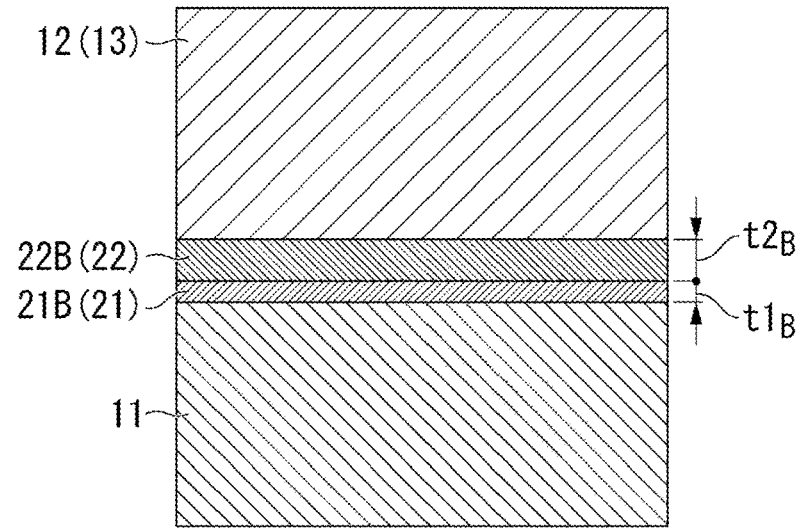
FIG. 3C is an enlarged view of the central part of the bonded interface of the insulating circuit substrate of FIG. 3A.

In addition, in the present embodiment, as shown in FIG. 3A, FIG. 3B, and FIG. 3C, it is preferable that an active metal compound layer 21 and an Ag—Cu alloy layer 22 are formed in this order from the ceramic substrate 11 side at the bonded interface between the ceramic substrate 11 and each of the circuit layer 12 and the metal layer 13.

It can be said that the active metal compound layer 21 is a part of the ceramic substrate (ceramic member) 11. It can also be said that the Ag—Cu alloy layer 22 is a part of each of the circuit layer (copper member) 12 and the metal layer (copper member) 13. For this reason, the bonded interface between the ceramic substrate 11 and each of the circuit layer 12 and the metal layer 13 (the copper sheets 42 and 43) is an interface between the active metal compound layer 21 and the Ag—Cu alloy layer 22. In a case where the Ag—Cu alloy layer 22 is not provided, the bonded interface between the ceramic substrate 11 and each of the circuit layer 12 and the metal layer 13 (the copper sheets 42 and 43) is an interface between the active metal compound layer 21 and each of the circuit layer 12 and the metal layer 13 (the copper sheets 42 and 43).

Here, in the insulating circuit substrate 10 which is the present embodiment, as shown in FIG. 3A, an interface structure in the end portion A and the central part B of the bonded interface between the ceramic substrate 11 and each of the circuit layer 12 and the metal layer 13 is defined as follows.

It is noted that in the present embodiment, the end portion A of the bonded interface between the ceramic substrate 11 and each of the circuit layer 12 and the metal layer 13 is, as shown in FIG. 3A, a region from the end portion of each of the circuit layer 12 and the metal layer 13 to a position at 200 μm inward in the width direction in a cross section along the lamination direction in which each of the circuit layer 12 and the metal layer 13 is laminated with the ceramic substrate 11.

In addition, as shown in FIG. 3A, the central part B of the bonded interface between the ceramic substrate 11 and each of the circuit layer 12 and the metal layer 13 is a region of 200 μm in the width direction, which includes the center of each of the circuit layer 12 and the metal layer 13 in the width direction in a cross section along the lamination direction in which each of the circuit layer 12 and the metal layer 13 is laminated with the ceramic substrate 11.

In the present embodiment, it is preferable that a thickness $t1_A$ of an active metal compound layer 21A formed in the end portion A of the bonded interface between the ceramic substrate 11 and each of the circuit layer 12 and the metal layer 13, and a thickness $t1_B$ of an active metal compound layer 21B formed in the central part B of the bonded interface between the ceramic substrate 11 and each of the circuit layer 12 and the metal layer 13 are set to be in a range of 0.05 μm or more and 1.2 μm or less, where a thickness ratio $t1_A/t1_B$ thereof is set to be in a range of 0.7 or more and 1.4 or less.

Here, the active metal compound layers 21A and 21B are each a layer consisting of a compound of the active metal (one or more selected from Ti, Zr, Nb, and Hf) that is used as the bonding material 45. More specifically, it is a layer consisting of a nitride of these active metals in a case where the ceramic substrate consists of silicon nitride ($Si_3N_4$) or aluminum nitride (AlN), and it is a layer consisting of an oxide of these active metals in a case where the ceramic substrate consists of alumina ($Al_2O_3$). The active metal compound layers 21A and 21B are formed by aggregating particles of an active metal compound. The average particle size of these particles is 10 nm or more and 100 nm or less.

It is noted that in the present embodiment, since a bonding material 45 contains Ti as an active metal and the ceramic substrate 11 is composed of aluminum nitride, the active metal compound layer 21 (21A and 21B) is composed of titanium nitride (TiN). That is, it is formed by aggregating titanium nitride (TiN) particles having an average particle size of 10 nm or more and 100 nm or less.

Further, in the present embodiment, it is preferable that a thickness $t2_A$ of an Ag—Cu alloy layer 22A formed in the end portion A of the bonded interface between the ceramic substrate 11 and each of the circuit layer 12 and the metal layer 13, and a thickness $t2_B$ of an Ag—Cu alloy layer 22B formed in the central part B of the bonded interface between the ceramic substrate 11 and each of the circuit layer 12 and the metal layer 13 are set to be in a range of 3 μm or more and 30 μm or less, where a thickness ratio $t2_A/t2_B$ thereof is set to be in a range of 0.7 or more and 1.4 or less.

Figure 4:
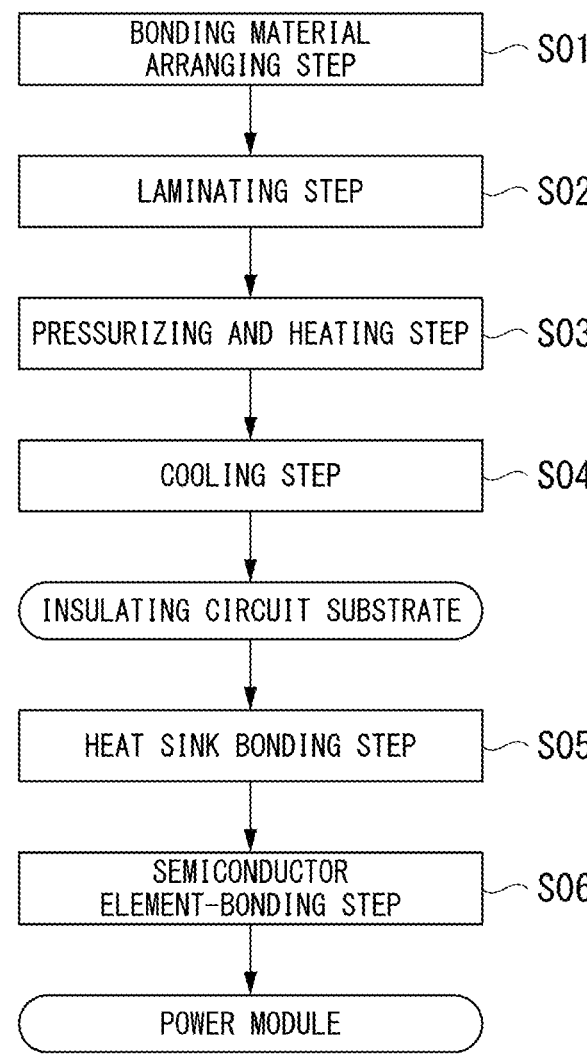
FIG. 4 is a flow chart of a manufacturing method for the insulating circuit substrate according to the embodiment of the present invention.

Hereinafter, a manufacturing method for the insulating circuit substrate 10 according to the present embodiment will be described with reference to FIG. 4 and FIG. 5.

(Bonding Material Arranging Step S01)

The copper sheet 42 which is to be the circuit layer 12 and the copper sheet 43 which is to be the metal layer 13 are prepared. Here, in the copper sheet 42 which is to be the circuit layer 12 and the copper sheet 43 which is to be the metal layer 13, a chamfered part is formed on the peripheral edge part of the surface that faces the ceramic substrate 11 side.

Then, the bonding material 45 is applied and dried on the bonding surface of the copper sheet 42 which is to be the circuit layer 12 and the bonding surface of the copper sheet 43 which is to be the metal layer 13. The coating thickness of the paste-like bonding material 45 is preferably set to be in a range of 10 μm or more and 50 μm or less after drying.

In the present embodiment, the paste-like bonding material 45 is applied by screen printing.

The bonding material 45 is a bonding material containing Ag and an active metal (one or more selected from Ti, Zr, Nb, or Hf). In the present embodiment, an Ag—Ti-based brazing material (an Ag—Cu—Ti-based brazing material) is used as the bonding material 45. As the Ag—Ti-based brazing material (the Ag—Cu—Ti-based brazing material), it is preferable to use, for example, a brazing material that contains Cu in a range of 0% by mass or more and 45% by mass or less contains Ti which is an active metal in a range of 0.5% by mass or more and 20% by mass or less, and has a balance of Ag and inevitable impurities.

Here, for the bonding material 45 to be applied, the film thickness in terms of Ag and the mass ratio Ag/active metal of Ag to the active metal are adjusted. This makes it possible to control the absolute amount and fluidity of an Ag—Cu liquid phase to be generated, in a pressurizing and heating step S03 described later.

Specifically, the film thickness in terms of Ag is preferably set to 2.5 μm or more and more preferably set to 3.5 μm or more. On the other hand, the film thickness in terms of Ag is preferably set to 20 μm or less and more preferably set to 15 μm or less.

In addition, the mass ratio Ag/active metal of Ag to the active metal is preferably set to 8 or more and more preferably set to 12 or more. On the other hand, the mass ratio Ag/active metal of Ag to the active metal is preferably set to 60 or less and more preferably set to 45 or less.

In addition, the specific surface area of the Ag powder contained in the bonding material 45 is preferably set to 0.15 m$^2$/g or more, more preferably set to 0.25 m$^2$/g or more, and still more preferably set to 0.40 m$^2$/g or more. On the other hand, the specific surface area of the Ag powder contained in the bonding material 45 is preferably set to 1.40 m$^2$/g or less, more preferably set to 1.00 m$^2$/g or less, and still more preferably set to 0.75 m$^2$/g or less.

Regarding the particle diameter of the Ag powder contained in the paste-like bonding material 45, it is preferable that D10 is in a range of 0.7 μm or more and 3.5 μm or less and D100 is 4.5 μm or more and 23 μm or less. In a particle size distribution measured according to a laser diffraction scattering type particle size distribution measuring method, D10 is a particle diameter at which the cumulative frequency is 10% on a volume basis, and D100 is a particle diameter at which the cumulative frequency is 100% on a volume basis.

(Laminating Step S02)

Next, the copper sheet 42 which is to be the circuit layer 12 is laminated on one surface (the upper surface in FIG. 5) of the ceramic substrate 11 by interposing the bonding material 45, and concurrently, the copper sheet 43 which is to be the metal layer 13 is laminated on the other surface (the lower surface in FIG. 5) of the ceramic substrate 11 by interposing the bonding material 45. It is noted that since the chamfered part is formed on the peripheral edge part of each of the copper sheet 42 which is to be the circuit layer 12 and the copper sheet 43 which is to be the metal layer 13, voids are formed in the end portion of the ceramic substrate 11.

(Pressurizing and Heating Step S03)

Next, the copper sheet 42, the ceramic substrate 11, and the copper sheet 43 are heated in a pressurized state in a heating furnace in a vacuum atmosphere, and the bonding material 45 is melted.

Here, the heating temperature in the pressurizing and heating step S03 is preferably set to be in a range of 800° C. or higher and 850° C. or lower. It is preferable that the total of the temperature integral values in the temperature raising step from 780° C. to the heating temperature and the holding step at the heating temperature is set to be in a range of 7° C.·h or more and 80° C.·h or less.

In addition, the pressurization load in the pressurizing and heating step S03 is preferably set to be in a range of 0.029 MPa or more and 2.94 MPa or less.

Further, the degree of vacuum in the pressurizing and heating step S03 is preferably set to be in a range of $1 \times 10^{-6}$ Pa or more and $5 \times 10^{-2}$ Pa or less.

(Cooling Step S04)

Then, after the pressurizing and heating step S03, cooling is carried out to solidify the molten bonding material 45, whereby the copper sheet 42 which is to be the circuit layer 12 is bonded to the ceramic substrate 11, and the ceramic substrate 11 is bonded to the copper sheet 43 which is to be the metal layer 13.

It is noted that the cooling rate in the cooling step S04 is preferably set to be in a range of 2° C./min or more and 20° C./min or less. It is noted that the cooling rate here is a cooling rate from the heating temperature to 780° C., which is an Ag—Cu eutectic temperature.

As described above, the insulating circuit substrate 10 which is the present embodiment is manufactured by the bonding material arranging step S01, the laminating step S02, the pressurizing and heating step S03, and the cooling step S04.

(Heat Sink Bonding Step S05)

Next, the heat sink 5 is bonded to the other surface side of the metal layer 13 of the insulating circuit substrate 10.

The insulating circuit substrate 10 and the heat sink 5 are laminated with a solder material being interposed therebetween and charged into a heating furnace, and the insulating circuit substrate 10 and the heat sink 5 are subjected to solder bonding with the solder layer 7 being interposed therebetween.

(Semiconductor Element-Bonding Step S06)

Next, the semiconductor element 3 is bonded by soldering to one surface of the circuit layer 12 of the insulating circuit substrate 10.

The power module 1 shown in FIG. 1 is produced by the above-described steps.

According to the insulating circuit substrate 10 (the copper/ceramic bonded body) according to the present embodiment configured as described above, since the distance h between the ceramic substrate 11 and each of the circuit layer 12 and the metal layer 13 in the end portion of each of the circuit layer 12 and the metal layer 13 is set to 3 μm or more at the bonded interface between the ceramic substrate 11 and each of the circuit layer 12 and the metal layer 13, and concurrently, and concurrently, the void ratio in an end portion region of each of the circuit layer 12 and metal layer 13 is set to 10% or less, the thickness of the bonding layer on the end surface is ensured, which makes it possible to sufficiently ensure the strength of the end portion each of the circuit layer 12 and the metal layer 13. As a result, it is possible to suppress the breaking or peeling of the ceramic substrate 11 in a case where a thermal cycle is loaded.

In addition, since the distance h between the ceramic substrate 11 and each of the circuit layer 12 and the metal layer 13 in the end portion of each of the circuit layer 12 and the metal layer 13 is set to 30 μm or more, it is possible to suppress the protrusion of the bonding material 45, and it is possible to suppress the occurrence of "braze staining".

It is noted that the distance h between the ceramic substrate 11 and each of the circuit layer 12 and the metal layer 13 in the end portion of each of the circuit layer 12 and the metal layer 13 is preferably set to 5 μm or more and more preferably set to 8 μm or more. On the other hand, the distance h between the ceramic substrate 11 and each of the circuit layer 12 and the metal layer 13 in the end portion of each of the circuit layer 12 and the metal layer 13 is preferably set to 25 μm or less and more preferably set to 20 μm or less.

In addition, the void ratio in an end portion region E of each of the circuit layer 12 and metal layer 13 at the bonded interface between the ceramic substrate 11 and each of the circuit layer 12 and metal layer 13 is preferably 8% or less and more preferably 5% or less.

In addition, in the present embodiment, in a case where a thickness $t1_A$ of an active metal compound layer 21A formed in the end portion A of each of the circuit layer 12 and the metal layer 13, and a thickness tin of an active metal compound layer 21B formed in the central part B of each of the circuit layer 12 and the metal layer 13 are set to be in a range of 0.05 μm or more and 1.2 μm or less, the active metal reliably and firmly bonds the ceramic substrate 11 to each of the circuit layer 12 and the metal layer 13, and concurrently, the hardening of the bonded interface is suppressed.

It is noted that in order to more firmly bond the ceramic substrate 11 to the circuit layer 12 and the metal layer 13, a thickness $t1_A$ of an active metal compound layer 21A formed in the end portion A of each of the circuit layer 12 and the metal layer 13, and a thickness tin of an active metal compound layer 21B formed in the central part B of each of the circuit layer 12 and the metal layer 13 are preferably set to 0.08 μm or more and more preferably set to 0.15 μm or more.

In addition, in order to further suppress reliably the hardening of the bonded interface, a thickness $t1_A$ of an active metal compound layer 21A formed in the end portion A of each of the circuit layer 12 and the metal layer 13, and a thickness $t1_B$ of an active metal compound layer 21B formed in the central part B of each of the circuit layer 12 and the metal layer 13 are preferably set to 1.0 μm or less and more preferably set to 0.6 μm or less.

Further, in the present embodiment, in a case where the ratio $t1_A/t1_B$ of the thickness $t1_A$ of the active metal compound layer 21A formed in the end portion A of each of the circuit layer 12 and the metal layer 13, to the thickness t1 of the active metal compound layer 21B formed in the central part B of each of the circuit layer 12 and the metal layer 13 is set to be in a range of 0.7 or more and 1.4 or less, there is no significant difference in the hardness of the bonded interface in the end portion A and the central part b of each of the circuit layer 12 and the metal layer 13, and it is possible to further suppress the occurrence of breaking in the ceramic substrate 11 during loading of a thermal cycle.

It is noted that in order to further suppress the occurrence of breaking in the ceramic substrate 11 during loading of a thermal cycle, a ratio $t1_A/tin$ of a thickness $t1_A$ of an active metal compound layer 21A formed in the end portion A of each of the circuit layer 12 and the metal layer 13, to a thickness $t1_B$ of an active metal compound layer 21B formed in the central part B of each of the circuit layer 12 and the metal layer 13 is preferably set to be in a range of 0.8 or more and 1.2 or less and more preferably set to be in a range of 0.9 or more and 1.1 or less.

In addition, in the present embodiment, in a case where the thickness $t2_A$ of the Ag—Cu alloy layer 22A formed in the end portion A of each of the circuit layer 12 and the metal layer 13, and the thickness $t2_B$ of the Ag—Cu alloy layer 22B formed in the central part B of each of the circuit layer 12 and the metal layer 13 are set to be in a range of 3 μm or more and 30 μm or less, the Ag of the bonding material 45 described later is sufficiently reacted with the circuit layer 12 and the metal layer 13 to bond the ceramic substrate 11 to the circuit layer 12 and the metal layer 13 reliably and firmly, and concurrently, the hardening of the bonded interface is suppressed.

It is noted that in order to more firmly bond the ceramic substrate 11 to the circuit layer 12 and the metal layer 13, the thickness $t2_A$ of the Ag—Cu alloy layer 22A formed in the end portion A of each of the circuit layer 12 and the metal layer 13, and the thickness $t2_B$ of the Ag—Cu alloy layer 22B formed in the central part B of each of the circuit layer 12 and the metal layer 13 are preferably set to 5 μm or more and more preferably set to 7 μm or more.

In addition, in order to further suppress the unnecessary hardening of the bonded interface, the thickness $t2_A$ of the Ag—Cu alloy layer 22A formed in the end portion A of each of the circuit layer 12 and the metal layer 13, and the thickness $t2_B$ of the Ag—Cu alloy layer 22B formed in the central part B of each of the circuit layer 12 and the metal layer 13 are preferably set to 25 m or less and more preferably set to 20 m or less.

Further, in the present embodiment, in a case where the ratio $t2_A/t2_B$ of the thickness $t2_A$ of the Ag—Cu alloy layer 22A formed in the end portion A of each of the circuit layer 12 and the metal layer 13, to the thickness $t2_B$ of the Ag—Cu alloy layer 22B formed in the central part B of each of the circuit layer 12 and the metal layer 13 is set to be in a range of 0.7 or more and 1.4 or less, there is no significant difference in the hardness of the bonded interface in the end portion A and the central part B of each of the circuit layer 12 and the metal layer 13, and it is possible to further suppress the occurrence of breaking in the ceramic substrate during loading of a thermal cycle.

It is noted that in order to further suppress the occurrence of breaking in the ceramic substrate 11 during loading of a thermal cycle, the ratio $t2_A/t2_B$ of the thickness $t2_A$ of the Ag—Cu alloy layer 22A formed in the end portion A of each of the circuit layer 12 and the metal layer 13, to the thickness $t2_B$ of the Ag—Cu alloy layer 22B formed in the central part B of each of the circuit layer 12 and the metal layer 13 is preferably set to be in a range of 0.8 or more and 1.2 or less and more preferably set to be in a range of 0.9 or more and 1.1 or less.

The embodiments according to the present invention have been described as above; however, the present invention is not limited to this, and they can be appropriately changed without departing from the technical ideas of the present invention.

For example, the present embodiment has been described such that a semiconductor element is mounted on an insulating circuit substrate to constitute a power module; however, the present embodiment is not limited thereto. For example, an LED element may be mounted on a circuit layer of an insulating circuit substrate to constitute an LED module, or a thermoelectric element may be mounted on a circuit layer of an insulating circuit substrate to constitute a thermoelectric module.

In addition, in the insulating circuit substrate according to the present embodiment, the description has been made using, as an example, a ceramic substrate composed of aluminum nitride (AlN). However, the present invention is not limited thereto, and the insulating circuit substrate may be an insulating circuit substrate that uses another ceramic substrate such as alumina ($Al_2O_3$) or silicon nitride ($Si_3N_4$).

Further, in the present embodiment, the description has been made using Ti as an example of the active metal contained in the bonding material. However, the present embodiment is not limited thereto, and any one or two or more active metals selected from Ti, Zr, Hf, and Nb may be contained. It is noted that these active metals may be contained as hydrides.

Further, in the present embodiment, the description has been made such that the circuit layer is formed by bonding a rolled plate of oxygen-free copper to the ceramic substrate. However, the present invention is not limited thereto, and the circuit layer may be formed by being bonded to the ceramic substrate in a state where copper pieces obtained by punching a copper sheet are disposed in a circuit pattern. In this case, it suffices that each of the copper pieces has such an interface structure as described above between the copper piece and the ceramic substrate.

Examples

Hereinafter, a description will be given for the results of confirmatory experiments carried out to confirm the effectiveness of the present invention.

First, a ceramic substrate (40 mm×40 mm) shown in Table 1 was prepared. It is noted that the thickness was set to 0.635 mm for AlN and $Al_2O_3$ and was set to 0.32 mm for $Si_3N_4$.

In addition, as the copper sheet which was to be each of the circuit layer and the metal layer, a copper sheet consisting of oxygen-free copper and having a thickness of 37 mm×37 mm shown in Table 1 was prepared. It is noted that in the copper sheet which is to be each of the circuit layer and the metal layer, a chamfered part was formed on the peripheral edge part on the ceramic substrate side.

Then, the bonding material was applied on the copper sheet which was to be each of the circuit layer and the metal layer. It is noted that a paste material was used as the bonding material, and the amounts of Ag, Cu, and the active metal were set as shown in Table 1. Here, as shown in Table 1, the thickness in terms of Ag and the mass ratio Ag/active metal of Ag to the active metal were adjusted.

A copper sheet which is to be a circuit layer was laminated on one surface of the ceramic substrate. In addition, a copper sheet which is to be a metal layer was laminated on the other surface of the ceramic substrate.

This laminate was heated in a state of being pressurized in the lamination direction to generate an Ag—Cu liquid phase. In this case, the pressurization load was set to 0.294 MPa, and the temperature integral value was as set shown in Table 1.

Then, the heated laminate was cooled to bond the copper sheet which was to be the circuit layer, the ceramic substrate, and the metal plate which was to be the metal layer to each other, whereby an insulating circuit substrate (copper/ceramic bonded body) was obtained.

Regarding the obtained insulating circuit substrate (copper/ceramic bonded body), the void ratio in the end portion, the distance between the ceramic substrate and the copper sheet in the end portion, the active metal compound layer, the Ag—Cu alloy layer, the thermal cycle reliability, and the presence or absence of braze staining were evaluated as follows.

(Void Ratio of End Portion)

In the cross section of the end portion of each of the bonded interface between the circuit layer and the ceramic substrate and the bonded interface between the ceramic substrate and the metal layer, an element map of each of Ag, Cu, and the active metal was acquired using an electron probe microanalyzer (EPMA analyzer). Each element map was acquired in both the five visual fields. Then, an area (void area) of a region in which Ag, Cu, and the active metal were not detected was determined in the end portion region.

The maximum value of the void ratio according to "void ratio=100×void area/area of end portion region" is defined as "the void ratio of the end portion", which is described in Table 2.

(Distance Between Ceramic Substrate and Copper Sheet at End Portion)

In each of the bonded interface between the circuit layer and the ceramic substrate and the bonded interface between the ceramic substrate and the metal layer, the above-described cross section of the end portion was subjected to the line analysis of the element of each of Ag, Cu, and active metal by using an EPMA analyzer. The line analysis of each element was carried out in both the five visual fields toward the circuit layer or the metal layer in a direction that passed through the intersection P and was perpendicular to the ceramic substrate. Then, the distance from the surface of the ceramic substrate to a region in which the Cu concentration was 90% by mass or more was measured under a setting of Ag+Cu+active metal=100% by mass. The shortest distance in both the five visual fields, a total of ten visual fields, was defined as "the distance between the ceramic substrate and the copper sheet in the end portion", which is described in Table 2.

(Active Metal Compound Layer)

The cross section of each of the bonded interface between the circuit layer and the ceramic substrate and the bonded interface between the ceramic substrate and the metal layer was subjected to measurement at a magnification of 30,000 times using an electron scanning microscope (ULTRA55 manufactured by Carl Zeiss NTS, LLC, acceleration voltage: 1.8 kV), and an element map of N, O, and the active metal element was acquired according to the energy dispersive X-ray analysis method. It was determined that the active metal compound layer is present in a case where the active metal element and N or O are present in the same region.

The observation was carried out in both the five visual fields, and the average value obtained by dividing an area in a range in which the active metal element and N or O were present in the same region by the measured width was defined as the "thickness of the active metal compound layer", which is shown in Table 2.

(Ag—Cu Alloy Layer)

In the cross section of each of the bonded interface between the circuit layer and the ceramic substrate and the bonded interface between the ceramic substrate and the metal layer, an element map of each of Ag, Cu, and the active metal was acquired using an EPMA analyzer. Each element map was acquired in both the five visual fields.

Then, a region in which the Ag concentration was 15% by mass or more was defined as the Ag—Cu alloy layer in a case where Ag+Cu+active metal was set to 100% by mass, and an area thereof was determined to determine a value obtained by dividing the area by a width of the measurement region (area/width of measurement region). The average of the values is shown in Table 2 as the thickness of the Ag—Cu alloy layer.

(Thermal Cycle Reliability)

The above-described insulating circuit substrate was subjected to the following thermal cycle according to the material of the ceramic substrate to determine the presence or absence of ceramic breaking according to an SAT examination (ultrasonic examination). The evaluation results are shown in Table 2. The number of times of occurrence of the ceramic breaking in Table 2 means the number of thermal cycles required until the ceramic breaking occurs.

In case of AlN or $Al_2O_3$: The SAT examination is carried out every 50 cycles up to 500 cycles, where one cycle is defined as a load of −40° C.×10 min and 150° C.×10 min.

In case of $Si_3N_4$: The SAT examination is carried out every 200 cycles up to 2,000 cycles, where one cycle is defined as a load of −40° C.×10 min and 150° C.×10 min.

(Presence or Absence of Braze Staining)

On the surface of the circuit layer and the surface of the metal layer, an element map of each of Ag, Cu, and the active metal was acquired using an EPMA analyzer. Then, a region in which the Ag concentration was 15% by mass or more was defined as "braze staining" under a setting of Ag+Cu+active metal=100% by mass, and an area thereof was determined. Then, it was determined that "braze staining" is present in a case where a value obtained by dividing the determined area by an area of a region of 100 μm from an outer periphery of each of the circuit layer and the metal layer was 20% or more.

μm, and the void ratio in the end portion region of the circuit layer (metal layer) was set to 16.3%, and the number of times of occurrence of breaking was 100 times in the thermal cycle test. In addition, braze staining was confirmed.

On the other hand, in Present Invention Example 1, the distance between the ceramic substrate and the circuit layer (metal layer) in the end portion of the circuit layer (metal layer) was set to 24.7 μm, and the void ratio in the end portion region of the circuit layer (metal layer) was set to 9.8%, and the number of times of occurrence of breaking was 400 times in the thermal cycle test. In addition, no braze staining was confirmed.

In Present Invention Example 2, the distance between the ceramic substrate and the circuit layer (metal layer) in the end portion of the circuit layer (metal layer) was set to 20.9 μm, and the void ratio in the end portion region of the circuit layer (metal layer) was set to 5.3%, and the number of times

TABLE 1

| | | Ceramic substrate Material | Circuit layer Thickness mm | Metal layer Thickness mm | Bonding material | | | |
|---|---|---|---|---|---|---|---|---|
| | | | | | Cu % by mass | Kind of active metal | Coating thickness in terms of Ag μm | Mass ratio Ag/active metal |
| Present Invention Example | 1 | AlN | 0.3 | 0.25 | — | Ti | 18 | 30.5 |
| | 2 | AlN | 0.3 | 0.25 | — | Ti | 15 | 44.5 |
| | 3 | AlN | 0.3 | 0.25 | 34.5 | Zr | 8 | 20.7 |
| | 4 | $Si_3N_4$ | 0.8 | 0.8 | 25.8 | Hf | 2.5 | 12.4 |
| | 5 | $Si_3N_4$ | 0.8 | 0.8 | 43.5 | Ti | 3.5 | 32.7 |
| | 6 | $Si_3N_4$ | 0.8 | 0.8 | — | Zr | 5 | 12.6 |
| | 7 | $Al_2O_3$ | 0.3 | 0.25 | — | Ti | 20 | 8.0 |
| | 8 | $Al_2O_3$ | 0.3 | 0.25 | — | Nb | 13 | 44.7 |
| Comparative Example | 1 | AlN | 0.3 | 0.25 | 32.5 | Hf | 10 | 10.8 |
| | 2 | $Si_3N_4$ | 0.8 | 0.8 | — | Zr | 25 | 51.3 |
| | 3 | $Al_2O_3$ | 0.3 | 0.25 | 25.8 | Ti | 2.5 | 11.5 |

TABLE 2

| | | Pressurizing and heating step temperature integral value °C · h | Void ratio (%) | End portion of copper sheet Distance between ceramic substrate and copper sheet (μm) | Active metal compound layer Thickness (μm) | | | Ag—Cu alloy layer Thickness (μm) | | | Thermal cycle reliability Number of times of occurrence of breaking (time) | Presence or absence of braze staining |
|---|---|---|---|---|---|---|---|---|---|---|---|---|
| | | | | | End portion $t1_A$ | Central part $t1_B$ | $t1_A/t1_B$ | End portion $t2_A$ | Central part $t2_B$ | $t2_A/t2_B$ | | |
| Present Invention Example | 1 | 62.4 | 9.8 | 24.7 | 0.93 | 1.18 | 0.79 | 21 | 25 | 0.84 | 400 | Absent |
| | 2 | 46.7 | 5.3 | 20.9 | 0.63 | 0.54 | 1.17 | 19 | 16 | 1.19 | 450 | Absent |
| | 3 | 29.2 | 0.8 | 12.1 | 0.46 | 0.42 | 1.10 | 12 | 11 | 1.09 | 500 | Absent |
| | 4 | 7.3 | 0.3 | 3.2 | 0.05 | 0.07 | 0.71 | 3 | 4 | 0.75 | 1600 | Absent |
| | 5 | 11.5 | 7.1 | 6.4 | 0.11 | 0.09 | 1.22 | 5 | 4 | 1.25 | 1800 | Absent |
| | 6 | 54.8 | 0.1 | 8.1 | 0.16 | 0.15 | 1.07 | 7 | 7 | 1.00 | >2000 | Absent |
| | 7 | 78.2 | 8.2 | 29.6 | 0.99 | 0.81 | 1.22 | 30 | 22 | 1.36 | 350 | Absent |
| | 8 | 21.3 | 4.8 | 19.6 | 0.27 | 0.29 | 0.93 | 17 | 18 | 0.94 | 450 | Absent |
| Example | 1 | 19.8 | 16.3 | 23.2 | 0.54 | 0.49 | 1.10 | 17 | 14 | 1.21 | 100 | Present |
| | 2 | 10.8 | 13.2 | 45.1 | 0.46 | 0.63 | 0.73 | 39 | 26 | 1.50 | 1200 | Present |
| | 3 | 109.1 | 0.0 | 1.3 | 0.02 | 0.01 | 2.00 | 1 | 0 | — | 50 | Absent |

First, Present Invention Examples 1 to 3, in which AlN has been used as a ceramic substrate, are compared with Comparative Example 1. In Comparative Example 1, the distance between the ceramic substrate and the circuit layer (metal layer) in the end portion of the circuit layer (metal layer) was set to 23.2 of occurrence of breaking was 450 times in the thermal cycle test. In addition, no braze staining was confirmed.

In Present Invention Example 3, the distance between the ceramic substrate and the circuit layer (metal layer) in the end portion of the circuit layer (metal layer) was set to 12.1 μm, and the void ratio in the end portion region of the circuit layer (metal layer) was set to 0.8%, and the number of times of occurrence of breaking was 500 times in the thermal cycle test. In addition, no braze staining was confirmed.

Next, Present Invention Examples 4 to 6 and Comparative Example 2, in which $Si_3N_4$ has been used as a ceramic substrate, are compared.

In Comparative Example 2, the distance between the ceramic substrate and the circuit layer (metal layer) in the end portion of the circuit layer (metal layer) was set to 45.1 μm, and the void ratio in the end portion region of the circuit layer (metal layer) was set to 13.2%, and the number of times of occurrence of breaking was 1,200 times in the thermal cycle test. In addition, braze staining was confirmed.

On the other hand, in Present Invention Example 4, the distance between the ceramic substrate and the circuit layer (metal layer) in the end portion of the circuit layer (metal layer) was set to 3.2 m, and the void ratio in the end portion region of the circuit layer (metal layer) was set to 0.3%, and the number of times of occurrence of breaking was 1,600 times in the thermal cycle test. In addition, no braze staining was confirmed.

In Present Invention Example 5, the distance between the ceramic substrate and the circuit layer (metal layer) in the end portion of the circuit layer (metal layer) was set to 6.4 μm, and the void ratio in the end portion region of the circuit layer (metal layer) was set to 7.1%, and the number of times of occurrence of breaking was 1,800 times in the thermal cycle test. In addition, no braze staining was confirmed.

In Present Invention Example 6, the distance between the ceramic substrate and the circuit layer (metal layer) in the end portion of the circuit layer (metal layer) was set to 8.1 μm, and the void ratio in the end portion region of the circuit layer (metal layer) was set to 0.1%, and no breaking occurred even after 2,000 times of cycles in the thermal cycle test. In addition, no braze staining was confirmed.

Next, Present Invention Examples 7 and 8 and Comparative Example 3, in which $Al_2O_3$ has been used as a ceramic substrate, are compared.

In Comparative Example 3, the distance between the ceramic substrate and the circuit layer (metal layer) in the end portion of the circuit layer (metal layer) was set to 1.3 μm, and the void ratio in the end portion region of the circuit layer (metal layer) was set to 0.0%, and the number of times of occurrence of breaking was 50 times in the thermal cycle test. It is noted that no braze staining was confirmed.

On the other hand, in Present Invention Example 7, the distance between the ceramic substrate and the circuit layer (metal layer) in the end portion of the circuit layer (metal layer) was set to 29.6 m, and the void ratio in the end portion region of the circuit layer (metal layer) was set to 8.2%, and the number of times of occurrence of breaking was 350 times in the thermal cycle test. In addition, no braze staining was confirmed.

In Present Invention Example 8, the distance between the ceramic substrate and the circuit layer (metal layer) in the end portion of the circuit layer (metal layer) was set to 19.6 μm, and the void ratio in the end portion region of the circuit layer (metal layer) was set to 4.8%, and the number of times of occurrence of breaking was 450 times in the thermal cycle test. In addition, no braze staining was confirmed.

From the results of the above-described confirmatory experiment, it was confirmed that according to Present Invention Examples, it is possible to provide an insulating circuit substrate (a copper/ceramic bonded body) in which thermal cycle reliability is excellent and the occurrence of braze staining is sufficiently suppressed.

INDUSTRIAL APPLICABILITY

According to the present invention, it is possible to provide a copper/ceramic bonded body in which thermal cycle reliability is excellent and the occurrence of braze staining is sufficiently suppressed, and an insulating circuit substrate consisting of this copper/ceramic bonded body.

REFERENCE SIGNS LIST

10: Insulating circuit substrate (copper/ceramic bonded body)
11: Ceramic substrate (ceramic member)
12: Circuit layer (copper member)
13: Metal layer (copper member)
21 (21A, 21B): Active metal compound layer
22 (22A, 22B): Ag—Cu alloy layer

The invention claimed is:

1. A copper/ceramic bonded body obtained by bonding a copper member consisting of copper or a copper alloy to a ceramic member,
wherein the copper member has a chamfered surface on a peripheral edge of a surface that faces the ceramic member to form a crevice between the copper member and the ceramic member,
a height h of the crevice from a surface of the ceramic member to an outermost edge of the copper member in a lamination direction is in a range of 3 μm or more and 30 μm or less, and
a void ratio in an end portion region of the copper member is 10% or less, the end portion region being a rectangular area enclosed by 30 μm in height and 400 μm in width at a bottom peripheral part of the copper member in a cross section in the lamination direction, a vertical side of the rectangular area closer to the peripheral edge is collinear with a virtual vertical line drawn from an intersection P to the surface of the ceramic member, the intersection P being an intersection of a side of the copper member and a line parallel to the surface of the ceramic member at a location ⅓ of a thickness of the copper member from the surface of the ceramic member.

2. The copper/ceramic bonded body according to claim 1, wherein at the bonded interface between the ceramic member and the copper member, an active metal compound layer is formed on a side of the ceramic member, and
a thickness $t1_A$ of the active metal compound layer from an end portion of the copper member, the end portion being a rectangular region extending from an outermost surface of the copper member 200 μm inward in the width direction in a cross section along the lamination direction, and a thickness $t1_B$ of the active metal compound layer from a central part of the copper member are in a range of 0.05 μm or more and 1.2 μm or less, where a thickness ratio $t1_A/t1_B$ is in a range of 0.7 or more and 1.4 or less, the central part being a rectangular region of 200 μm in a width direction including a center of the copper member at a center thereof in the cross section.

3. The copper/ceramic bonded body according to claim 1, wherein at the bonded interface between the ceramic member and the copper member, an Ag—Cu alloy layer is formed on a side of the copper member, and a thickness $t2_A$ of the Ag—Cu alloy layer from an end portion of the copper member, the end portion being a rectangular region extending from an outermost surface of the copper member 200 μm inward in the width direction in a cross section along the lamination direction, and a thickness $t2_B$ of the Ag—Cu alloy layer from a central part of the copper member are in a range of 3 μm or more and 30 μm or less, where a thickness ratio $t2_A/t2_B$ is in a range of 0.7 or more and 1.4 or less, the central part being a rectangular region of 200 μm in a width direction including a center of the copper member at a center thereof in the cross section.

4. An insulating circuit substrate obtained by bonding a copper sheet consisting of copper or a copper alloy to a surface of a ceramic substrate, wherein the copper sheet has a chamfered surface on a peripheral edge of a surface that faces the ceramic substrate to form a crevice between the copper sheet and the ceramic substrate, at a bonded interface between the ceramic substrate and the copper sheet, a height h of the crevice from a surface of the ceramic substrate to an outermost edge of the copper sheet in a lamination direction is set to be in a range of 3 μm or more and 30 μm or less, and a void ratio in an end portion region of the copper sheet is 10% or less, the end portion region being a rectangular area enclosed by 30 μm in height and 400 μm in width at a bottom peripheral part of the copper sheet in a cross section in the lamination direction, a vertical side of the rectangular area closer to the peripheral edge is collinear with a virtual vertical line drawn from an intersection P to the surface of the ceramic substrate, the intersection P being an intersection of a side of the copper sheet and a line parallel to the surface of the ceramic substrate at a location ⅓ of a thickness of the copper sheet from the surface of the ceramic substrate.

5. The insulating circuit substrate according to claim 4, wherein at the bonded interface between the ceramic substrate and the copper sheet, an active metal compound layer is formed on a side of the ceramic substrate, and a thickness $t1_A$ of the active metal compound layer from an end portion of the copper sheet, the end portion being a rectangular region extending from an outermost surface of the copper sheet 200 μm inward in the width direction in a cross section along the lamination direction, and a thickness $t1_B$ of the active metal compound layer from a central part of the copper sheet are in a range of 0.05 μm or more and 1.2 μm or less, where a thickness ratio $t1_A/t1_B$ is in a range of 0.7 or more and 1.4 or less, the central part being a rectangular region of 200 μm in a width direction including a center of the copper sheet at a center thereof in the cross section.

6. The insulating circuit substrate according to claim 4, wherein at the bonded interface between the ceramic substrate and the copper sheet, an Ag—Cu alloy layer is formed on a side of the copper sheet, and a thickness $t2_A$ of the Ag—Cu alloy layer from an end portion of the copper sheet, the end portion being a rectangular region extending from an outermost surface of the copper sheet 200 μm inward in the width direction in a cross section along the lamination direction, and a thickness $t2_B$ of the Ag—Cu alloy layer from a central part of the copper sheet are in a range of 3 μm or more and 30 μm or less, where a thickness ratio $t2_A/t2_B$ is in a range of 0.7 or more and 1.4 or less, the central part being a rectangular region of 200 μm in a width direction including a center of the copper sheet at a center thereof in the cross section.

7. The copper/ceramic bonded body according to claim 1, wherein the ceramic member is made of one of silicon nitride, aluminum nitride, and alumina.

8. The copper/ceramic bonded body according to claim 1, wherein the copper member is made of a rolled plate of oxygen-free copper.

9. The copper/ceramic bonded body according to claim 1, wherein a thickness of the ceramic member is 0.2 mm or more and 1.5 mm or less.

10. The copper/ceramic bonded body according to claim 1, wherein the thickness of the copper member is 0.1 mm or more and 2.0 mm or less.

11. The copper/ceramic bonded body according to claim 2, wherein the ceramic substrate is made of silicon nitride or aluminum nitride, and the active metal compound layer is formed of aggregated particles of a nitride of Ti, Zr, Nb or Hf, and an average particle size thereof is 10 nm or more and 100 nm or less.

12. The copper/ceramic bonded body according to claim 2, wherein the ceramic substrate is made of aluminum oxide, and the active metal compound layer is formed of aggregated particles of an oxide of Ti, Zr, Nb or Hf, and an average particle size thereof is 10 nm or more and 100 nm or less.

13. The insulating circuit substrate according to claim 4, wherein the copper sheet is made of a rolled plate of oxygen-free copper.

14. The insulating circuit substrate according to claim 4, wherein a thickness of the ceramic substrate is 0.2 mm or more and 1.5 mm or less.

15. The insulating circuit substrate according to claim 4, wherein the thickness of the copper sheet is 0.1 mm or more and 2.0 mm or less.

16. The insulating circuit substrate according to claim 5, wherein the ceramic substrate is made of silicon nitride or aluminum nitride, and the active metal compound layer is formed of aggregated particles of a nitride of Ti, Zr, Nb or Hf, and an average particle size thereof is 10 nm or more and 100 nm or less.

17. The insulating circuit substrate according to claim 5, wherein the active metal compound layer is formed of aggregated particles of an oxide of Ti, Zr, Nb or Hf, and an average particle size thereof is 10 nm or more and 100 nm or less.

\* \* \* \* \*